(12) United States Patent
Sekine

(10) Patent No.: US 10,078,104 B2
(45) Date of Patent: Sep. 18, 2018

(54) LOAD DRIVE CIRCUIT

(71) Applicant: Hitachi Automotive Systems, Ltd., Hitachinaka-shi, Ibaraki (JP)

(72) Inventor: Daisuke Sekine, Ibaraki (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 154 days.

(21) Appl. No.: 15/113,925

(22) PCT Filed: Dec. 10, 2014

(86) PCT No.: PCT/JP2014/082606
§ 371 (c)(1),
(2) Date: Jul. 25, 2016

(87) PCT Pub. No.: WO2015/118772
PCT Pub. Date: Aug. 13, 2015

(65) Prior Publication Data
US 2016/0341776 A1 Nov. 24, 2016

(30) Foreign Application Priority Data

Feb. 6, 2014 (JP) .................................. 2014-020901

(51) Int. Cl.
*G01R 31/40* (2014.01)
*B60R 16/02* (2006.01)
(Continued)

(52) U.S. Cl.
CPC ............ *G01R 31/006* (2013.01); *B60L 11/18* (2013.01); *B60R 16/02* (2013.01); *G01R 31/007* (2013.01);
(Continued)

(58) Field of Classification Search
CPC .... B60R 16/02; G01R 31/006; G01R 31/007; G01R 31/024; G01R 31/40; H02M 1/32;
(Continued)

(56) References Cited

U.S. PATENT DOCUMENTS 5,859,845 A * 1/1999 Oniishi ............... B60R 16/0315
307/10.1
7,457,089 B2 * 11/2008 Ohshima ............... H02M 3/156
324/500
(Continued)

FOREIGN PATENT DOCUMENTS

EP 2 040 364 A2 3/2009
JP 51-134115 U 10/1976
(Continued)

OTHER PUBLICATIONS

Japanese-language Office Action issued in counterpart Japanese Application No. 2015-561173 dated Jun. 6, 2017 (five (5) pages).
(Continued)

*Primary Examiner* — Levi Gannon
(74) *Attorney, Agent, or Firm* — Crowell & Moring LLP

(57) ABSTRACT

A load drive circuit incorporated into an onboard electronic control device, the load drive circuit housing a diagnosis circuit for diagnosing load abnormalities, wherein diagnosis circuit failures are detected without affecting load drive control. When a failure has occurred in the diagnosis circuit, vehicle operation is not affected because the diagnosis circuit does not have a function for controlling the vehicle, and there may be cases in which occupants riding an the vehicle do not notice the failure. Additionally, when a failure has occurred in the diagnosis circuit, the occurrence of the failure cannot be detected even by a vehicle control system as long as there is no function for detecting occurrences of failure in the diagnosis circuit. Specifically, when a failure has occurred in the diagnosis circuit, there is a possibility
(Continued)

that the failure is unrecognizable to occupants and undetectable by a vehicle control system. When there is no need for the diagnosis circuit to diagnose load abnormalities, a determination of whether or not the diagnosis circuit is failing is made by sending a pseudo abnormality signal to the diagnosis circuit and confirming whether the diagnosis circuit can detect the sent pseudo abnormality signal as a failure.

13 Claims, 9 Drawing Sheets

(51) Int. Cl.
    *H02M 1/32* (2007.01)
    *H02M 3/156* (2006.01)
    *H02P 29/024* (2016.01)
    *G01R 31/00* (2006.01)
    *G01R 31/02* (2006.01)
    *B60L 11/18* (2006.01)
    *H02M 1/08* (2006.01)
    *H02M 1/00* (2006.01)

(52) U.S. Cl.
    CPC ............ *G01R 31/024* (2013.01); *G01R 31/40* (2013.01); *H02M 1/08* (2013.01); *H02M 1/32* (2013.01); *H02M 3/156* (2013.01); *H02M 2001/0009* (2013.01)

(58) Field of Classification Search
    CPC .......... H02M 3/156; H02M 2001/0009; H02P 29/027
    USPC ...................................................... 307/10.1
    See application file for complete search history.

(56) References Cited

U.S. PATENT DOCUMENTS

| | | | | |
|---|---|---|---|---|
| 7,772,725 | B2* | 8/2010 | Siman-Tov | H02M 3/157 307/140 |
| 9,676,357 | B2* | 6/2017 | Dittfeld | B60R 21/0173 |
| 9,800,042 | B2* | 10/2017 | Engelhardt | G01R 31/024 |
| 2004/0004483 | A1* | 1/2004 | Hazelton | G01R 31/024 324/522 |
| 2004/0080886 | A1* | 4/2004 | Ishikawa | H02M 3/156 361/62 |
| 2005/0135036 | A1* | 6/2005 | Kanamori | H02M 3/156 361/93.1 |
| 2005/0194998 | A1* | 9/2005 | Watanabe | H02P 29/027 327/109 |
| 2006/0018636 | A1* | 1/2006 | Watanabe | F02D 11/107 388/804 |
| 2006/0256497 | A1* | 11/2006 | Sugimura | G01R 31/3278 361/160 |
| 2009/0026993 | A1 | 1/2009 | Nishibe et al. | |
| 2009/0079435 | A1 | 3/2009 | Nakata et al. | |
| 2009/0322302 | A1* | 12/2009 | Fukushi | H02M 1/32 323/284 |
| 2011/0234189 | A1* | 9/2011 | Tanihara | H02M 3/156 323/282 |

FOREIGN PATENT DOCUMENTS

| | | |
|---|---|---|
| JP | 6-261404 A | 9/1994 |
| JP | 2000-298152 A | 10/2000 |
| JP | 2005-257473 A | 9/2005 |
| JP | 2007-76462 A | 3/2007 |
| JP | 2009-77542 A | 4/2009 |
| JP | 2012-127194 A | 7/2012 |
| JP | 2013-43518 A | 3/2013 |

OTHER PUBLICATIONS

Extended European Search Report issued in counterpart European Application No. 14881568.1 dated Aug. 11, 2017 (seven pages).
International Search Report (PCT/ISA/210) issued in PCT Application No. PCT/JP2014/082606 dated Mar. 17, 2015 with English translation (Two (2) pages).
Japanese-language Written Opinion (PCT/ISA/237) issued in PCT Application No. PCT/JP2014/082606 dated Mar. 17, 2015 (Four (4) pages).

* cited by examiner

LOAD DRIVE CIRCUIT

TECHNICAL FIELD

The present invention relates to a load drive circuit which is incorporated into an electronic control device mounted on a vehicle and in which a diagnosis circuit is embedded.

BACKGROUND ART

There is a case where a drive element is turned on or off according to PWM drive or frequency drive and thereby a load such as, a solenoid, a relay, a heater, or a motor is driven, for control of a vehicle. In the related art, a load drive circuit includes a diagnosis circuit that diagnoses a state of a load which is driven, and diagnoses the state of the load by measuring a predetermined physical quantity of the load drive circuit. There is a case where the diagnosis circuit continuously diagnoses whether or not abnormality occurs in the load which is driven during an operation of the vehicle.

Meanwhile, in a case where the diagnosis circuit fails, a passenger riding in the vehicle may not be aware of the failure, because the diagnosis circuit does not have a function control the vehicle thereby not affecting the operation of the vehicle. In addition, in a case where the diagnosis circuit fails, a vehicle control system is also not able to detect the failure, since there is no function to detect that the diagnosis circuit fails. That is, in a case where a diagnosis circuit fails a potential failure can occur in which a passenger is not able to recognize the failure and the vehicle control system is not able to detect the failure.

If abnormality occurs in a load which is driven in a state where a diagnosis circuit fails, the diagnosis circuit is not able to detect the abnormality of the load, and furthermore, it is also not possible to activate a protection function to protect a load drive circuit from the abnormality of the load. That is, if double failures occur in which abnormality occurs in the load in a state where the diagnosis circuit fails, the protection function is also not able to be activated, and thus, the load drive circuit can be broken in the worst case.

In PTL 1, if a drive stop signal is inputted from a control circuit which controls a drive circuit during initialization processing of a system after an ignition key of a vehicle is turned on or during stop processing of the system after the ignition key of the vehicle is turned off, at least the drive circuit stops, and thereby a normal operation of a diagnosis circuit which diagnoses a state of the load is confirmed in a state where the load drive circuit is incorporated into an electronic control device.

CITATION LIST

Patent Literature

PTL 1: JP-A-2009-77542

SUMMARY OF INVENTION

Technical Problem

However, in the aforementioned method, whether or not the diagnosis circuit fails is confirmed when the ignition key is turned on or off, and thus, in a case where a failure occurs while a vehicle travels, it takes time to find the failure. If abnormality occurs in the load which is driven during this time, the load drive circuit is broken due to double failures, and there is a possibility that the load is not able to be controlled.

For this reason, in a case where the diagnosis circuit fails, it is preferable that the failure is quickly detected and thereby a passenger is notified of the failure by a warning light or the like, for example, even in a case where the failure does not affect control of the vehicle.

An object of the present invention is to confirm the presence or absence of abnormality of a diagnosis circuit in a load drive circuit by inputting a pseudo abnormality signal without affecting the load drive control during an operation of a vehicle.

Solution to Problem

The object can be achieved by inputting a pseudo abnormality signal into a diagnosis circuit to diagnose whether or not abnormality occurs in the diagnosis circuit, for example, during control of a load, when the diagnosis circuit does not diagnose abnormality of the load, as an example.

Advantageous Effects of Invention

According to the present invention, whether or not the diagnosis circuit in a load drive circuit fails can be determined by inputting a pseudo abnormality signal in each load drive period, without affecting load drive control.

DESCRIPTION OF EMBODIMENTS

Embodiment 1

Hereinafter, embodiments of the present invention will be described with reference to the accompanying drawings.

Figure 1:
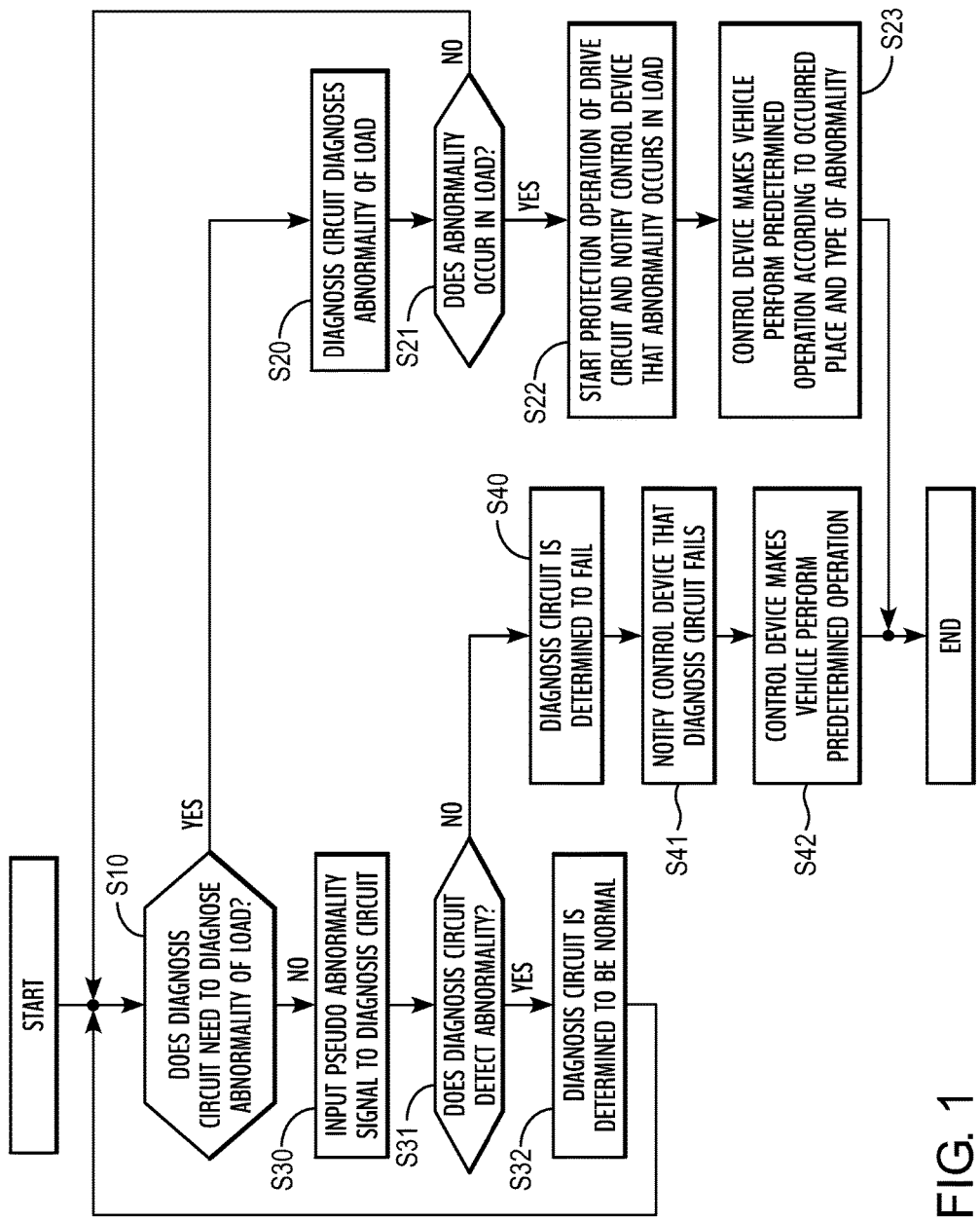
FIG. 1 is a flowchart illustrating a sequence for confirming whether or not a diagnosis circuit fails, based on a state of a drive element.

FIG. 1 is a flowchart illustrating a sequence for confirming whether or not a diagnosis circuit fails, based on a state of a drive element.

First, in step S10 illustrated in FIG. 1, it is determined whether or not a current state is a state in which it is necessary for the diagnosis circuit to diagnose abnormality of a load, based on a state of a drive element.

In a case where the drive element is in a state in which it is necessary for the diagnosis circuit to diagnose abnormality of the load (S10 determination: Yes), the diagnosis circuit diagnoses whether or not abnormality occurs in the load. In a case where the diagnosis circuit does not detect that abnormality occurs in the load (step S21: No), the diagnosis circuit determines that a state of the load is normal, and returns to S10 determination. In a case where the diagnosis circuit detects that abnormality occurs in the load (step S21: Yes), the diagnosis circuit starts an operation of protecting a load drive circuit from abnormality which occurs if necessary, and furthermore, notifies a main control device such as a microcomputer of the occurrence of the abnormality. The main control device causes a vehicle to perform a predetermined operation according to a place where the abnormality occurs, a type of the abnormality, or the like.

In a case where the drive element is in a state in which it is not necessary for the diagnosis circuit to diagnose abnormality of the load (S10 determination: No), the diagnosis circuit does not need to diagnose whether or not abnormality occurs in the load. For this reason, during a period in which the diagnosis circuit does not need to diagnose, a pseudo abnormality signal corresponding to a physical quantity being generated when the load is abnormal is inputted to the diagnosis circuit, whether or not the diagnosis circuit can detect the pseudo abnormality signal as the abnormality of the load is confirmed, and thus, it is possible to confirm whether or not the diagnosis circuit fails. In a case where a signal indicating that the diagnosis circuit detects the abnormality of the load is outputted as a result of inputting the pseudo abnormality signal, to the diagnosis circuit (step S31: Yes) it is determined that the diagnosis circuit does not fail, and the processing returns to S10 determination. Meanwhile, in a case where the signal indicating that the diagnosis circuit detects the failure is not outputted as a result of inputting the pseudo abnormality signal to the diagnosis circuit (step S31: No), it is determined that the diagnosis circuit fails, and the main control device such as a microcomputer is notified of the fact that the diagnosis circuit fails. The main control device notifies a driver by lighting a warning lamp, in accordance with a failed location or the like of the diagnosis circuit, thereby causing the vehicle to perform the predetermined operation.

Hereinafter, a specific example will be described with reference to FIG. 2.

Figure 2:
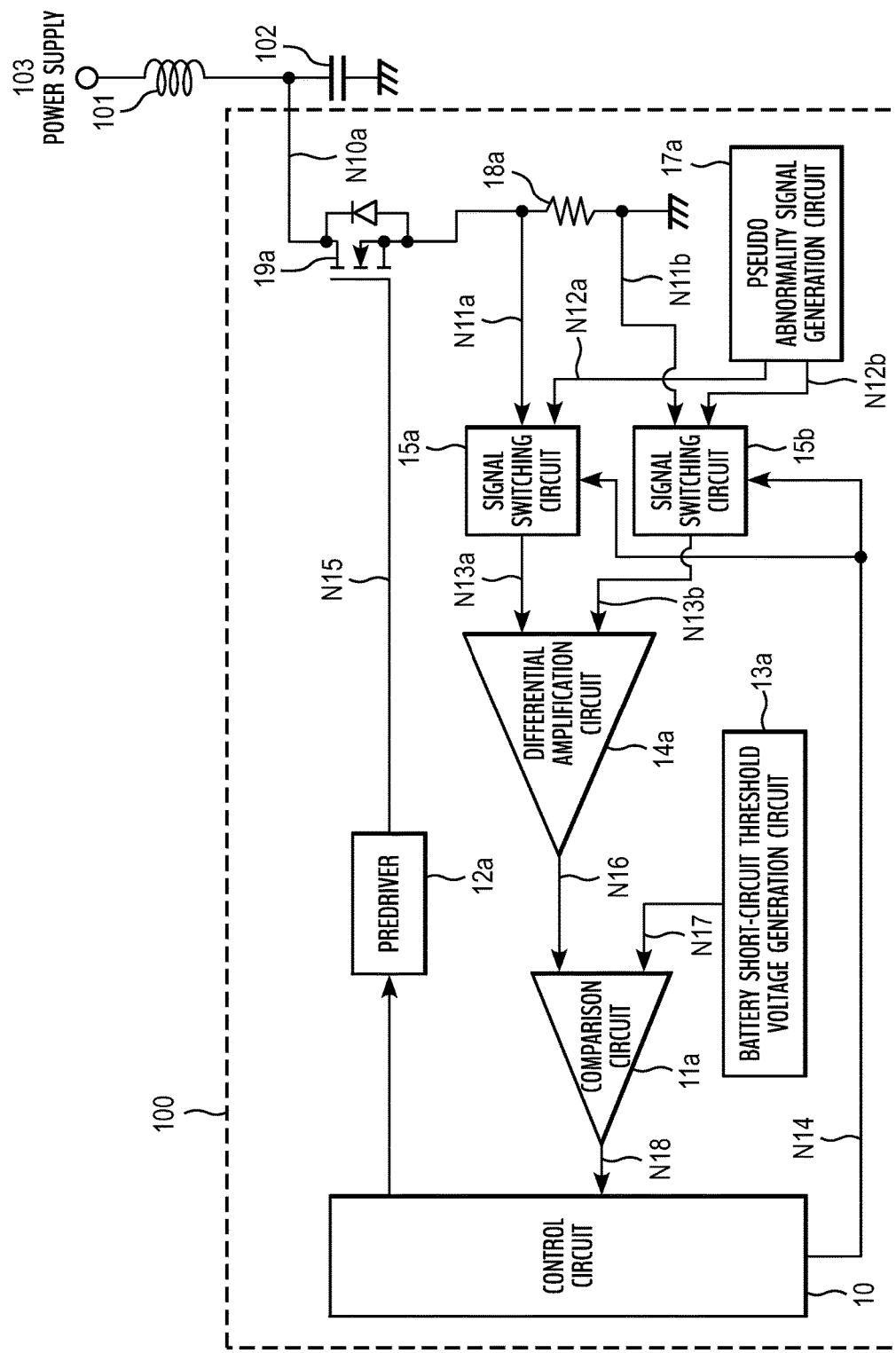
FIG. 2 illustrates a load drive circuit 1 with a low side driver configuration having a battery short-circuit detection circuit, as the diagnosis circuit.

FIG. 2 illustrates a load drive circuit with a low side driver configuration having a battery short-circuit detection function according to overcurrent detection as the diagnosis circuit.

A load drive circuit 100 with a low side driver configuration is provided in a lower portion of a power supply 103 and a load 101, and is configured by a drive element MOSFET 19a and a predriver 12a for driving the drive element MOSFET, a current detection resistor 18a for diagnosing a current flowing through the drive element MOSFET 19a, a differential amplification circuit 14a which amplifies a both-terminal voltage of the current detection resistor 18a, a battery short-circuit threshold voltage generation circuit 13a which determines a threshold value determining whether or not an overcurrent flows due to a battery short-circuit, a comparison circuit 11a which determines whether or not the overcurrent flows by comparing an output voltage of the differential amplification circuit 14a with a value of the battery short-circuit threshold voltage generation circuit 13a, a battery short-circuit pseudo abnormality signal generation circuit 17a which generates a voltage corresponding to a voltage which is generated in both terminals of the current detection resistor 18a when the overcurrent flows due to a battery short-circuit, signal switching circuits 15a and 15b which receive a both-terminal voltage of the current detection resistor 18a and outputs of the battery short-circuit pseudo abnormality signal generation circuit 17a and switch signals that are inputted to the differential amplification circuit 14a, and a control circuit 10 which controls operations thereof.

While not illustrated, the load drive circuit may include a clamp diode for protecting drive elements or a free wheeling diode which refluxes a current, according to characteristics of the load that is driven.

The diagnosis circuit which diagnoses a battery short-circuit of FIG. 2 is configured by the current detection resistor 18a, the differential amplification circuit 14a, the battery short-circuit threshold voltage generation circuit. 13a, and the comparison circuit 11a.

In a case where a battery short-circuit occurs due to abnormality of the load 101 when the drive element MOSFET 19a is turned on, a large current flows through the current detection resistor 18a and thereby the both-terminal voltage difference of the current detection resistor 18a increases, an output voltage of the differential amplification circuit 14a which amplifies the both-terminal voltage difference increases, and when the output voltage exceeds a voltage which is generated by the battery short-circuit threshold voltage generation circuit 13a, the diagnosis circuit determines that the overcurrent flows due to the battery short-circuit and notifies the control circuit 10. The control circuit 10 which is notified of the generation of the battery short-circuit starts a protection operation of transmitting a signal for stopping a current by turning off the drive element MOSFET 19a to the predriver 12a, or the like.

Meanwhile, when the drive element MOSFET 19a is turned off, a current does not flow even in a case where the battery short-circuit is generated due to the abnormality of the load 101, and thus, the diagnosis circuit does not need to diagnose an overcurrent due to the battery short-circuit.

That is, in a case where the drive element is switched to ON or OFF for load drive control, when the drive element does not need diagnosis which is performed by the diagnosis circuit, it is possible to prevent the failure of the diagnosis circuit from becoming a potential failure without affecting load drive for vehicle control, if whether or not the diagnosis circuit fails is confirmed.

Figure 3:
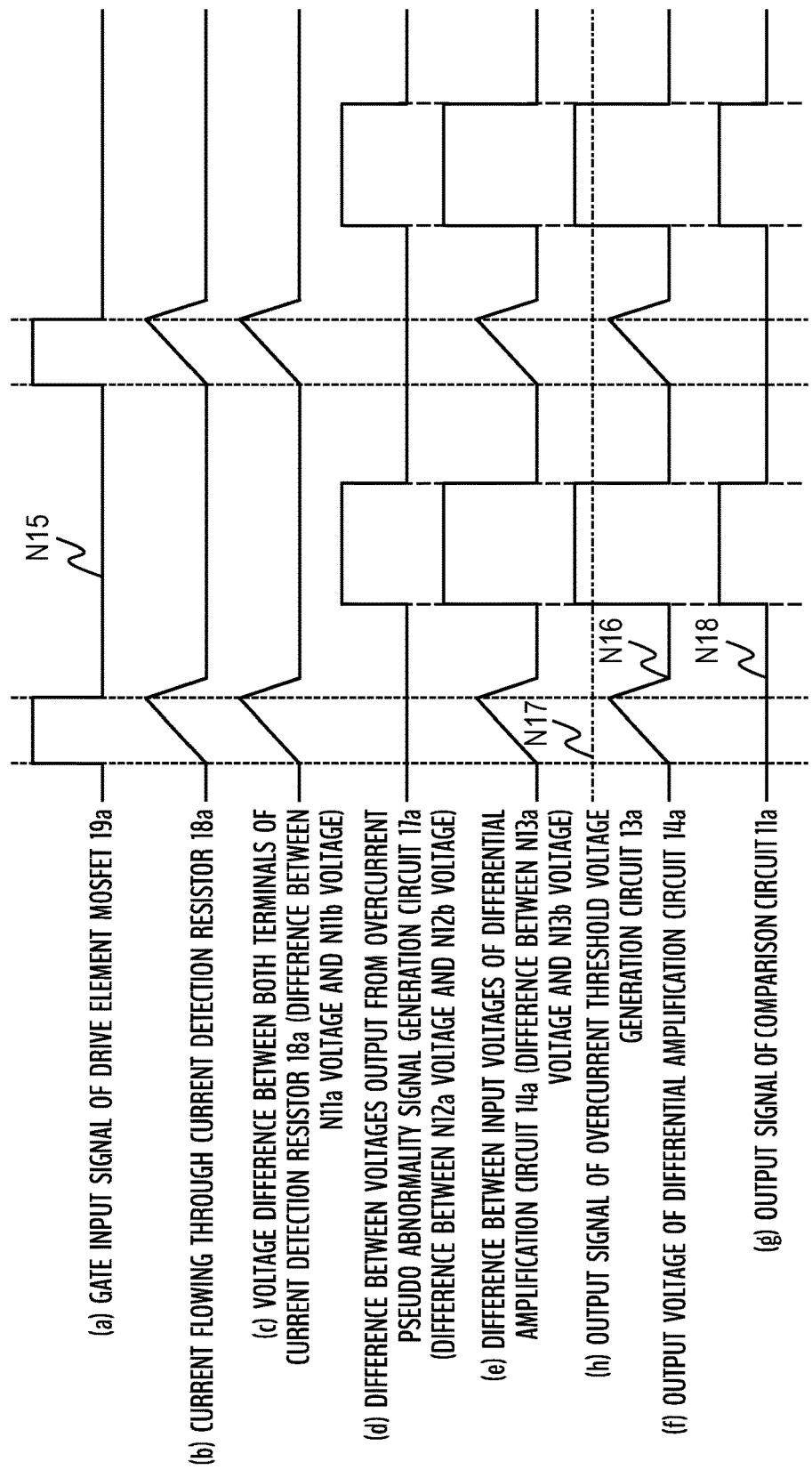
FIG. 3 is a timing chart 1 illustrating an operation of FIG. 2.

Hereinafter, an operation sequence to confirm whether or not the diagnosis circuit which diagnoses a battery short-circuit fails will be described with reference to FIG. 3.

The control circuit 10 transmits a signal which controls the load drive to the predriver 12a, and a gate input signal N15 of the drive element MOSFET 19a illustrated in FIG. 3(a) is inputted to the drive element MOSFET 19a.

While the gate input signal N15 is at a high level, the drive element MOSFET 19a is turned on, and a current illustrated in FIG. 3(b) flows through the current detection resistor 18a. At this time, a voltage drop occurs in the current detection resistor 18a, and a voltage difference between an upper side signal N11a of the current detection resistor 18a and a lower side signal N11b thereof is illustrated in FIG. 3(c). While the gate input signal N15 is at a high level, the control circuit 10 controls the signal switching circuits 15a and 15b, and performs control such that the upper side signal N11a of the current detection resistor 1ea is outputted as an output signal N13a of the signal switching circuit 15a and the lower side signal N11b of the current detection resistor 18a is outputted as an output signal N13b of the signal switching circuit 15b.

Meanwhile, while the gate input signal N15 is at a low level, the drive element MOSFET 19a is turned off. At this time, in a case where the overcurrent flows due to the battery short-circuit, the battery short-circuit pseudo abnormality signal generation circuit 17a generates voltage signals with levels corresponding to voltages which are generated in the upper side signal N11a and the lower side signal N11b of the current detection resistor 18a, and respectively outputs the voltage signals to the signal switching circuits 15a and 15b as an upper side output signal N12a and a lower side output signal N12b of the battery short-circuit pseudo abnormality signal generation circuit 17a. FIG. 3(d) illustrates a waveform of a voltage difference between the upper side output signal N12a and the lower side output signal N12b which are generated by the battery short-circuit pseudo abnormality signal generation circuit 17a. While the gate input signal N15 is at a low level, the control circuit 10 controls the signal switching circuits 15a and 15b, and performs control such that the upper side output signal N12a of the battery short-circuit pseudo abnormality signal generation circuit 17a is outputted as the output signal N13a of the signal switching circuit 15a and the lower side output signal N12b of the battery short-circuit pseudo abnormality signal generation circuit 17a is outputted as the output signal N13b of the signal switching circuit 15b.

A voltage difference of the signal which is inputted to the differential amplification circuit 14a as a result of the control is illustrated in FIG. 3(e). The differential amplification circuit 14a amplifies a waveform which is inputted and outputs the amplified waveform as an output signal N16. A voltage waveform of the output signal N16 of the differential amplification circuit 14a is illustrated in FIG. 3(f).

The output signal N16 of the differential amplification circuit 14a is inputted to the comparison circuit 11a, and is compared with a voltage which is generated by the battery short-circuit threshold voltage generation circuit 13a that determines a threshold value level of battery short-circuit determination. A signal N17 which is generated and outputted by and from the battery short-circuit threshold voltage generation circuit 13a is illustrated in FIG. 3(h). When an output voltage of the differential amplification circuit 14a exceeds a voltage which is generated by the battery short-circuit threshold voltage generation circuit 13a, the comparison circuit 11a determines that an overcurrent flows due to a battery short-circuit, and outputs an output signal N18 with a high level to the control circuit 10.

The battery short-circuit pseudo abnormality signal generation circuit 17a generates a voltage corresponding to a voltage which is generated at both terminals of the current detection resistor 18a, when an overcurrent flows due to a battery short-circuit. Accordingly, if the differential amplification circuit 14a, the comparison circuit 11a, the battery short-circuit threshold voltage generation circuit 13a, the signal switching circuits 15a and 15b, or the battery short-circuit pseudo abnormality signal generation circuit 17a does not fail, the comparison circuit 11a outputs a signal with a high level to the control circuit 10, as illustrated in FIG. 3(g). Meanwhile, in a case where the comparison circuit 11a does not output the signal with a high level to the control circuit 10, it is determined that at least one of the differential amplification circuit 14a, the comparison circuit 11a, the battery short-circuit threshold voltage generation circuit 13a, the signal switching circuits 15a and 15b, and the battery short-circuit pseudo abnormality signal generation circuit 17a fails.

As described above, when the drive element MOSFET 19a is turned off, a voltage corresponding to a voltage which is generated at both terminals of the current detection resistor 18a is inputted to the diagnosis circuit when an overcurrent flows due to a battery short-circuit, and the diagnosis circuit confirms whether or not abnormality is detected. Accordingly, it is possible to determine whether or not abnormality occurs in the diagnosis circuit.

In FIG. 3(d), while the gate input signal N15 is at a low level, one pseudo abnormality signal is inputted, but one or more pseudo abnormality signals are inputted, and when the diagnosis circuit detects one or more abnormalities, the diagnosis circuit may be determined to be normal.

In addition, as illustrated in FIG. 4(d), the battery short-circuit pseudo abnormality signal generation circuit 27a confirms that, after at least two types of pseudo abnormality signals of a pseudo abnormality signal P10 of a level in which a battery short-circuit will not be detected and a pseudo abnormality signal P11 of a level in which the battery short-circuit will be detected are inputted, the comparison circuit 11e does not detect abnormality when the pseudo abnormality signal P10 is inputted, and the comparison circuit 11a detects the abnormality when the pseudo abnormality signal P11 is inputted. Accordingly, it is possible to determine that a threshold value for determining the battery short-circuit exists between a voltage level of the pseudo abnormality signal P10 and a voltage level of the pseudo abnormality signal P11.

Figure 4:
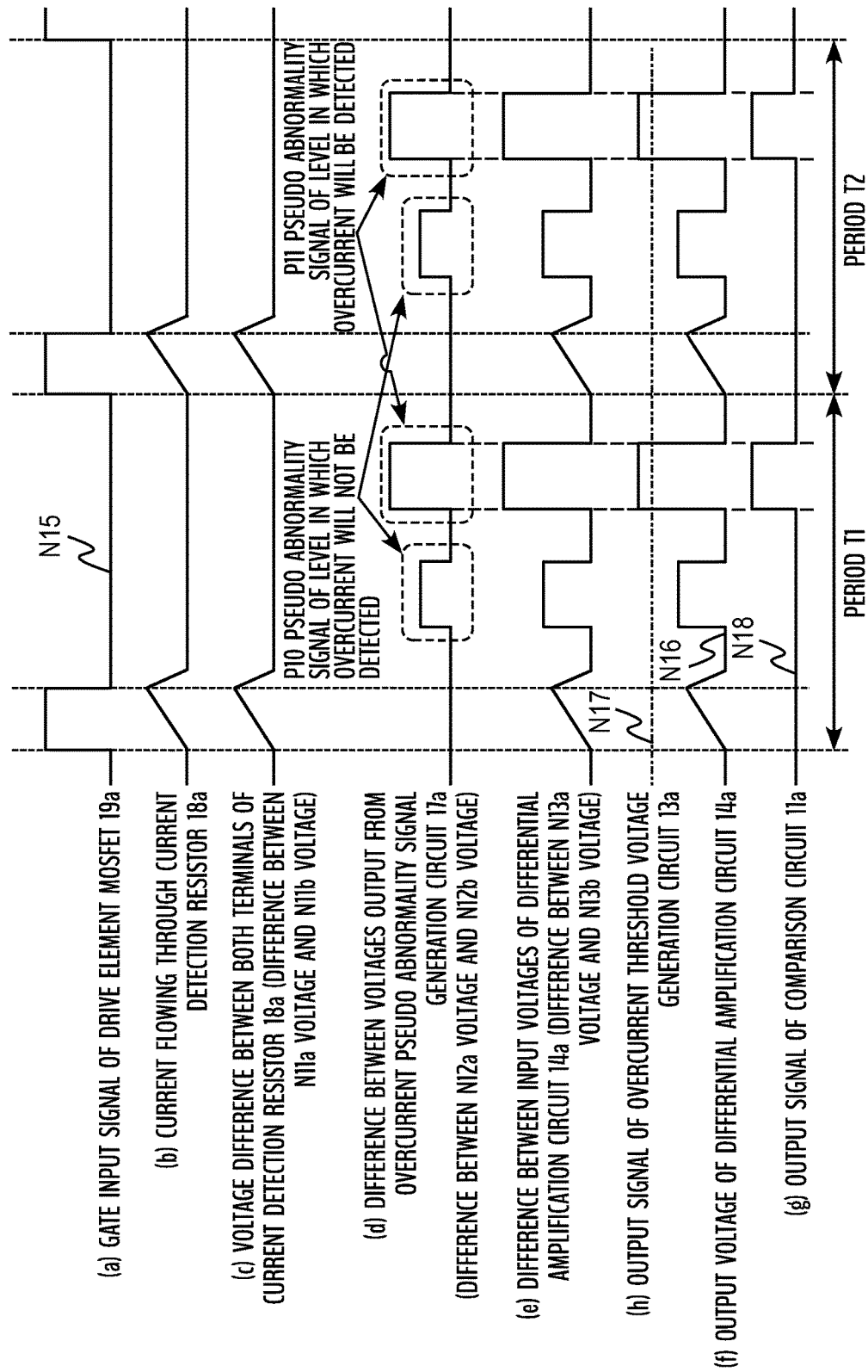
FIG. 4 is a timing chart 2 illustrating the operation of FIG. 2.

Furthermore, as illustrated in FIG. 4, in a case where the pseudo abnormality signals are inputted in two periods of a period T1 and a period T2 which are continuous and the diagnosis circuit detects a failure in the two continuous periods using the pseudo abnormality signals, it may be determined that the diagnosis circuit is normal. The continuous periods in which the pseudo abnormality signals are inputted and the diagnosis circuit detects a failure may be two or more.

In a case where a signal indicating flowing of an overcurrent due to the battery short-circuit is detected when the drive element MOSFET 19a is turned off, the abnormality detection is performed by inputting the pseudo abnormality signals, and thus, the abnormality detection is masked by the control circuit 10 or the like, and control is performed such that an operation of the load drive circuit is not affected.

Embodiment 2

Figure 5:
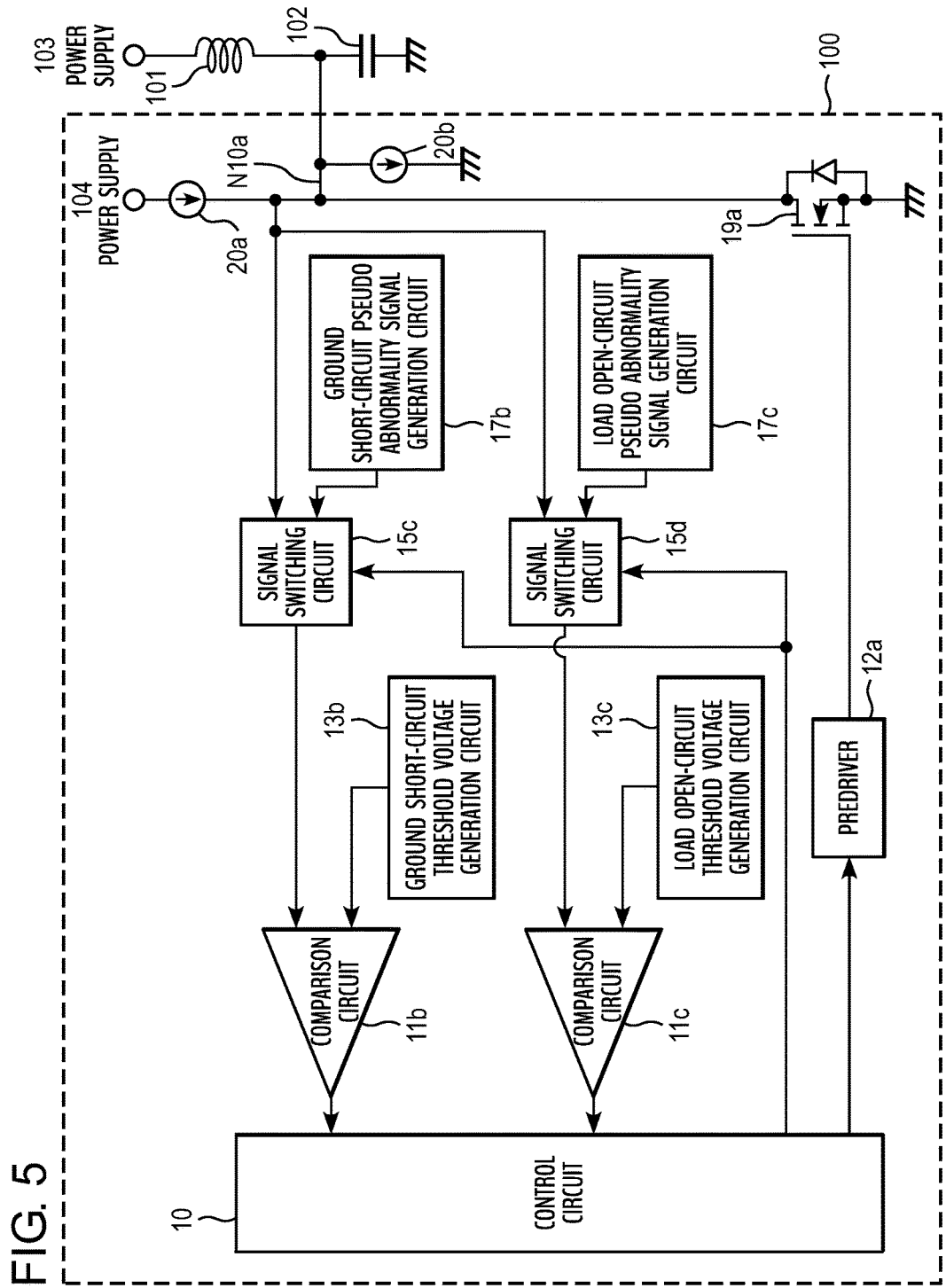
FIG. 5 illustrates a load drive circuit with a low side driver configuration having a ground short-circuit detection circuit and a load open-circuit detection circuit as the diagnosis circuit.

FIG. 5 relates to Embodiment 2, and illustrates a load drive circuit with a low side driver configuration having a ground short-circuit detection function and a load open-circuit detection function as the diagnosis circuit.

When the drive element MOSFET 19a is turned off, in a case where a ground short-circuit is generated due to abnormality of the load 101, a drain signal N10a of the drive element MOSFET 19a reaches a ground potential, and thus, the comparison circuit 11b compares a potential of the drain signal N10a of the drive element MOSFET 19a with a voltage which is generated by a ground short-circuit threshold voltage generation circuit 13b, and in a case where the potential of the drain signal N10a is lower than the voltage which is generated by the ground short-circuit threshold voltage generation circuit 13b, ground short-circuit detection means in a load drive circuit illustrated in FIG. 5 determines that the load is in a state of being ground short-circuited.

Meanwhile, when the drive element MOSFET 19a is turned off, constant current sources 20a and 20b charge or discharge the electric charges of a capacitor 102 so as to change the potential of the drain signal N10a to a predetermined potential, and a comparison circuit 11c compares the potential of the drain signal N10a with a voltage which is generated by a load open-circuit threshold voltage generation circuit 13c, and in a case where the potential of the drain signal N10a is higher than the voltage which is generated by the load open-circuit threshold voltage generation circuit 13c, load open-circuit detection means in the load drive circuit illustrated in FIG. 5 determines that the load is in a state of being open-circuited.

While not illustrated, the load drive circuit may include a clamp diode for protecting drive elements or a free wheeling diode which refluxes a current, according to characteristics of the load that is driven.

Even though any one abnormality state of the ground short-circuit and the load open-circuit occurs, when the drive element MOSFET 19a is turned on, the potential of the drain signal N10a reaches the ground potential, and thus it is not possible to detect the abnormality state. That is, when the drive element MOSFET 19a is turned on, it is not necessary to diagnose a load open-circuit or a ground short-circuit due to abnormality of the load 101, and thus, during this period, a pseudo abnormality signal is inputted to the diagnosis circuit which diagnoses the ground short-circuit and the load open-circuit, and thereby, it is possible to determine whether or not the diagnosis circuit fails without affecting load drive control.

Specifically, during a period in which the drive element MOSFET 19a is turned off, the control circuit 10 controls signal switching circuits 15c and 15d, thereby connecting the drain signal N10a to the comparison circuits 11b and 11c. During this period, the comparison circuits 11b and 11c compare the potential of the drain signal N10a with a voltage which is generated by the ground short-circuit threshold voltage generation circuit 13b that determines a threshold voltage for detecting abnormality thereof and a voltage which is generated by the load open-circuit threshold voltage generation circuit 13c which determines a threshold voltage for detecting abnormality thereof, and thereby ground short-circuit abnormality and load open-circuit abnormality are diagnosed.

Meanwhile, during a period in which the drive element MOSFET 19a is turned on, the control circuit 10 controls the signal switching circuits 15c and 15d, thereby connecting a voltage which is generated by a ground short-circuit pseudo abnormality signal generation circuit 17b which generates a voltage corresponding to a voltage that is generated in the drain signal N10a to the comparison circuit 11b when the ground short-circuit is generated, and connecting a voltage which is generated by a load open-circuit pseudo abnormality signal generation circuit 17c which generates the voltage corresponding to the voltage that is generated in the drain signal N10a to the comparison circuit 11c when a load open-circuit occurs.

The comparison circuit 11b compares the voltage which is generated by the ground short-circuit pseudo abnormality signal generation circuit 17b with the voltage which is generated by the ground short-circuit threshold voltage generation circuit 13b, and notifies the control circuit 10 of detected abnormality, in a case where the voltage which is generated by the ground short-circuit pseudo abnormality signal generation circuit 17b is lower than the voltage which is generated by the ground short-circuit threshold voltage generation circuit 13b. Since the voltage which is generated by the ground short-circuit pseudo abnormality signal generation circuit 17b generates a voltage corresponding to the voltage which is generated in the drain signal N10a when the ground short-circuit is generated, it can be determined that the diagnosis circuit is normal in a case where the comparison circuit 11b detects abnormality. Meanwhile, in a case where the comparison circuit 11b does not detect abnormality, the diagnosis circuit is determined to fail.

In the same manner, the comparison circuit 11c compares a voltage which is generated by the load open-circuit pseudo abnormality signal generation circuit 17c with a voltage which is generated by the load open-circuit threshold voltage generation circuit 13c, and notifies the control circuit 10 of detected abnormality, in a case where the voltage which is generated by the load open-circuit pseudo abnormality signal generation circuit 17c is higher than the voltage which is generated by the load open-circuit threshold voltage generation circuit 13c. Since the voltage which is generated by the load open-circuit pseudo abnormality signal generation circuit 17c generates a voltage corresponding to the voltage which is generated in the drain signal N10a when the load open-circuit occurs, it can be determined that the diagnosis circuit is normal in a case where the comparison circuit 11c detects abnormality. Meanwhile, in a case where the comparison circuit 11c does not detect abnormality, the diagnosis circuit is determined to fail.

In inputting the pseudo abnormality signal to the diagnosis circuit, one or more pseudo abnormality signals are inputted while the drive element MOSFET 19a is turned on within one cycle of the control signal, and when the diagnosis circuit detects one or more abnormalities, it may be determined that the diagnosis circuit is normal.

In addition, in the same manner as in FIG. 4(d) of Embodiment 1, the ground short-circuit pseudo abnormality signal generation circuit 17b and the load open-circuit pseudo abnormality signal generation circuit 17c generate at least two types of pseudo abnormality signals of the pseudo abnormality signal of a level in which abnormality will not be detected and the pseudo abnormality signal of a level in which abnormality will be detected, and thus, it is possible to determine that a threshold value for detecting abnormality exists between the two types of pseudo abnormality signal levels.

Furthermore, in the same manner as in FIG. 4 of Embodiment 1, in a case where the pseudo abnormality signal is inputted in one or more continuous periods and the diagnosis circuit detects a failure using the pseudo abnormality signal in the one or more continuous periods, it may be determined that the diagnosis circuit is normal.

In a case where a signal indicating abnormality is detected when the drive element MOSFET 19a is turned on, the abnormality detection is performed by inputting the pseudo abnormality signal, and thus, the abnormality detection is masked by the control circuit 10 or the like and control is performed such that an operation of the load drive circuit is not affected.

Embodiment 3

Figure 6:
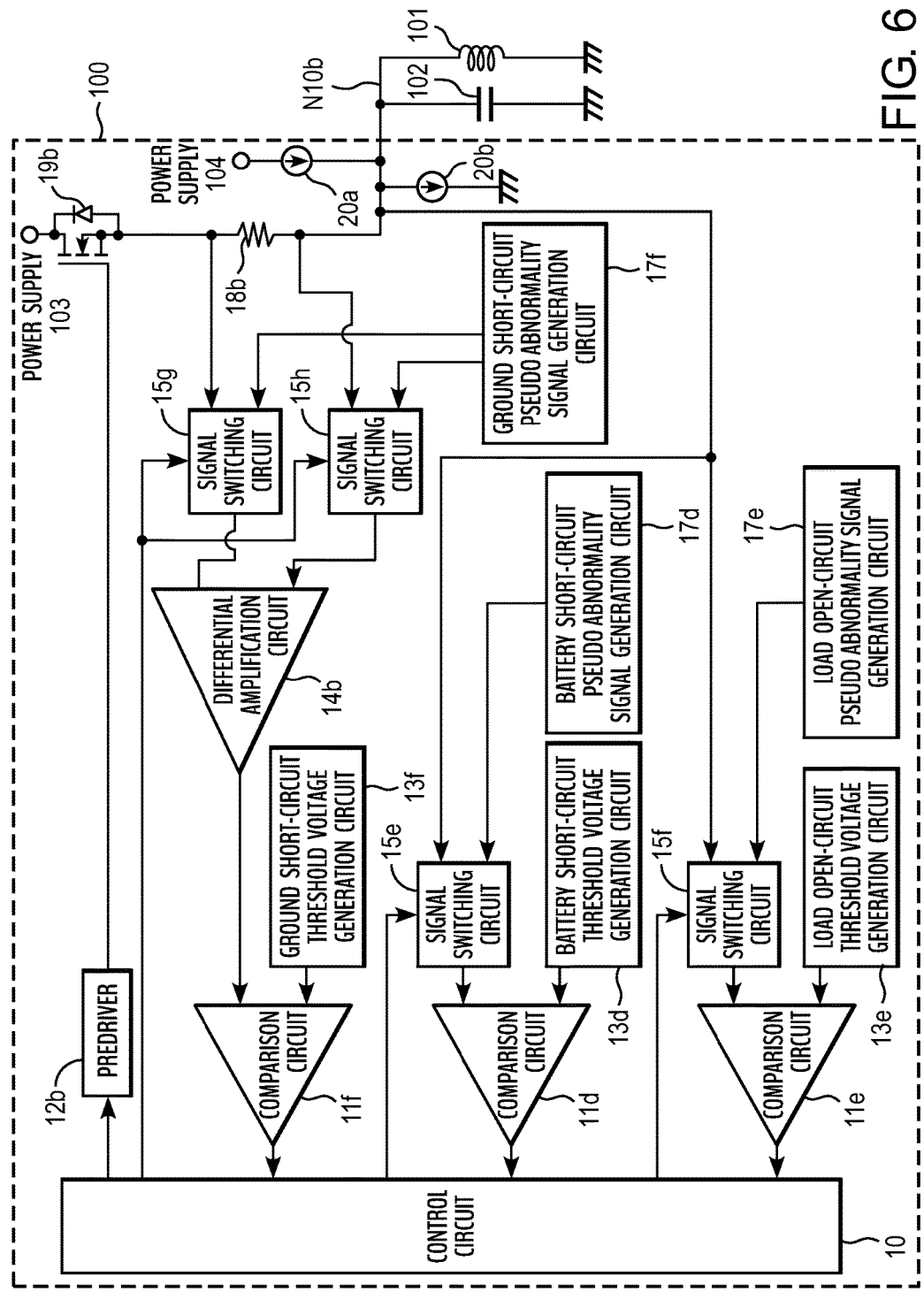
FIG. 6 illustrates a load drive circuit with a high side driver configuration having the ground short-circuit detection circuit, the load open-circuit detection circuit, and the battery short-circuit detection circuit as the diagnosis circuit.

FIG. 6 relates to Embodiment 3, and illustrates a load drive circuit with a high side driver configuration having a battery short-circuit detection function, a load open-circuit detection function, and a ground short-circuit detection function as the diagnosis circuit.

When the drive element MOSFET 19b is turned off, in a case where a battery short-circuit is generated due to abnormality of the load 101, a source signal N10b of the drive element MOSFET 19b reaches a battery potential, and thus, a comparison circuit 11d compares a potential of the source signal N10b with a voltage which is outputted from a battery short-circuit threshold voltage generation circuit 13d, and in a case where the potential of the source signal N10b higher than the voltage which is outputted from the battery short-circuit threshold voltage generation circuit 13d, battery short-circuit detection means in a load drive circuit illustrated in FIG. 6 determines that the load is in a state of being battery short-circuited.

In addition, when the drive element MOSFET 19b is turned off, constant current sources 20a and 20b charge or discharge the electric charges of a capacitor 102 so as to change the potential of the source signal N10b to a predetermined potential, and a comparison circuit 11e compares the potential of the source signal N10b with the voltage which is generated by the load open-circuit threshold voltage generation circuit 13c, and in a case where the potential of the source signal N10b is higher than the voltage which is outputted from the load open-circuit threshold voltage generation circuit 13c, load open-circuit detection means in the load drive circuit illustrated in FIG. 6 determines that the load is in an open-circuit state.

Furthermore, when the drive element MOSFET 19b is turned on, in a case where a ground short-circuit is generated due to abnormality of the load 101, a large current flows through a current detection resistor 18b and thereby a both-terminal voltage difference of the current detection resistor 18b increases, an output voltage of a differential amplification circuit 14b which amplifies the both-terminal voltage difference increases, and a comparison circuit 11f compares the output voltage of the differential amplification circuit 14b with a voltage which is generated by a ground short-circuit threshold voltage generation circuit 13f, and in a case where the output voltage of the differential amplification circuit 14b is higher than the voltage which is generated by the ground short-circuit, threshold voltage generation circuit 13f, ground short-circuit detection means according to an overcurrent detection of the load drive circuit illustrated in FIG. 6 determines that the ground is in a short-circuit state.

While not illustrated, the load drive circuit may include a clamp diode for protecting drive elements or a free wheeling diode which refluxes a current, according to characteristics of the load that is driven.

Even though an abnormality state of the battery short-circuit or the load open-circuit occurs, when the drive element MOSFET 19b is turned on, the potential of the source signal N10b reaches the ground potential, and thus it is not possible to detect the abnormality state by using the potential of the source signal N10b. That is, when the drive element MOSFET 19b is turned on, it is not necessary to diagnose the battery short-circuit and the load open-circuit due to abnormality of the load 101, and thus, during this period, a pseudo abnormality signal is inputted to the diagnosis circuit which diagnoses the battery short-circuit and the load open-circuit, and thereby, it is possible to determine whether or not the diagnosis circuit fails without affecting the load drive control.

Specifically, in relation to the battery short-circuit and the load open-circuit, during a period in which the drive element MOSFET 19b is turned off, the control circuit 10 controls signal switching circuits 15e and 15f, thereby connecting the source signal N10b to the comparison circuits 11d and 11e.

During this period, the comparison circuits 11d and 11e compare the potential of the source signal N10b with a voltage which is generated by the battery short-circuit threshold voltage generation circuit 13d that determines a threshold voltage for detecting abnormality thereof and a voltage which is generated by the load open-circuit threshold voltage generation circuit 13e which determines a threshold voltage for detecting abnormality thereof, and thereby battery short-circuit abnormality and load open-circuit abnormality are diagnosed.

Meanwhile, in relation to the battery short-circuit and the load open-circuit, during a period in which the drive element MOSFET 19b is turned on, the control circuit 10 controls the signal switching circuits 15e and 15f, thereby connecting a voltage which is generated by a battery short-circuit pseudo abnormality signal generation circuit 17d which generates a voltage corresponding to a voltage that is generated in the source signal N10b when the battery short-circuit is generated to the comparison circuit 11d, and connecting a voltage which is generated by a load open-circuit pseudo abnormality signal generation circuit 17e which generates the voltage corresponding to the voltage that is generated in the source signal N10b when a load open-circuit occurs the comparison circuit 11e.

The comparison circuit 11d compares the voltage which is generated by the battery short-circuit pseudo abnormality signal generation circuit 17d with the voltage which is generated by the battery short-circuit threshold voltage generation circuit 13d, and notifies the control circuit 10 of detected battery short-circuit, in a case where the voltage which is generated by the battery short-circuit pseudo abnormality signal generation circuit 17d is higher than the voltage which is generated by the battery short-circuit threshold voltage generation circuit 13d. Since the voltage which is generated by the battery short-circuit pseudo abnormality signal generation circuit 17d generates a voltage corresponding to the voltage which is generated in the source signal N10b when the battery short-circuit is generated, it can be determined that the diagnosis circuit is normal in a case where the comparison circuit 11d detects abnormality. Meanwhile, in a case where the comparison circuit 11d does not detect abnormality, the diagnosis circuit is determined to fail.

In the same manner, the comparison circuit 11e compares a voltage which is generated by the load open-circuit, pseudo abnormality signal generation circuit 17e with a voltage which is generated by the load open-circuit threshold voltage generation circuit 13e, and notifies the control circuit 10 of detected abnormality, in a case where the voltage which is generated by the load open-circuit pseudo abnormality signal generation circuit 17e is higher than the voltage which is generated by the load open-circuit threshold voltage generation circuit 13e. Since the voltage which is generated by the load open-circuit pseudo abnormality signal generation circuit 17e generates a voltage corresponding to the voltage which is generated in the source signal N10b when the load open-circuit occurs, it can be determined that the diagnosis circuit, is normal in a case where the comparison circuit 11e detects abnormality. Meanwhile, in a case where the comparison circuit 11e does not detect abnormality, the diagnosis circuit is determined to fail.

In relation to a ground short-circuit, even though an abnormality state of the ground short-circuit is generated, when the drive element MOSFET 19b is turned off, a current does not flow, and thus it is not possible to detect the ground short-circuit abnormality by using the current detection resistor 18b. That is, when the drive element MOSFET 19b is turned off, it is not necessary to diagnose the ground short-circuit due to abnormality of the load 101, and thus, a pseudo abnormality signal is inputted to the diagnosis circuit which diagnoses the ground short-circuit, and thereby, it is possible to determine whether or not the diagnosis circuit fails without affecting the load drive control.

Specifically, during a period in which the drive element MOSFET 19b is turned on, the control circuit 10 controls signal switching circuits 15g and 15h, thereby connecting an upper side signal and a lower side signal of the current detection resistor 18b to the differential amplification circuit 14b. By the ground short-circuit, a large current flows through the current detection resistor 18b and thereby a both-terminal voltage difference of the current detection resistor 18b increases, an output voltage of the differential amplification circuit 14b which amplifies the both-terminal voltage difference increases, and when the output voltage exceeds a voltage which is generated by the ground short-circuit threshold voltage generation circuit 13f, it is determined that an overcurrent flows due to the ground short-circuit and the control circuit 10 is notified of the ground short-circuit. The control circuit 10 which is notified of the generation of the ground short-circuit transmits a signal for stopping a current by turning off the drive element MOSFET 19b to a predriver 12b.

Meanwhile, during a period in which the drive element MOSFET 19b is turned off, the control circuit 10 controls the signal switching circuits 15g and 15h, thereby connecting a voltage which is generated by the ground short-circuit pseudo abnormality signal generation circuit 17f which generates a voltage corresponding to a voltage that is generated on an upper side and a lower side of the current detection resistor 18b in a case where an overcurrent flows due to the ground short-circuit to the differential amplification circuit 14b.

The comparison circuit 11f compares the voltage which is generated by the ground short-circuit pseudo abnormality signal generation circuit 17f and is amplified by the differential amplification circuit 14b with the voltage which is generated by the ground short-circuit threshold voltage generation circuit 13f, and notifies the control circuit 10 of detected abnormality, in a case where the voltage which is generated by the ground short-circuit pseudo abnormality signal generation circuit 17f and is amplified by the differential amplification circuit 14b is higher than the voltage which is generated by the ground short-circuit threshold voltage generation circuit 13f. Since the voltage which is generated by the ground short-circuit pseudo abnormality signal generation circuit 17f generates a voltage corresponding to the voltage which is generated on the upper side and the lower side of the current detection resistor 18b when the ground short-circuit is generated, it can be determined that the diagnosis circuit is normal in a case where the comparison circuit 11f detects abnormality. Meanwhile, in a case where the comparison circuit 11f does not detect abnormality, the diagnosis circuit is determined to fail.

In inputting the pseudo abnormality signal to the diagnosis circuit, one or more pseudo abnormality signals are inputted while the drive element MOSFET 19b is turned on within one cycle of the control signal, and when the diagnosis circuit detects one or more abnormalities, it may be determined that the diagnosis circuit is normal.

In the same manner as in FIG. 4(d) of Embodiment 1, the battery short-circuit pseudo abnormality signal generation circuit 17d, the load open-circuit pseudo abnormality signal generation circuit 17e, and the ground short-circuit pseudo abnormality signal generation circuit 17f input at least two types of pseudo abnormality signals of the pseudo abnormality signal of a level in which abnormality will not be detected and the pseudo abnormality signal of a level in which abnormality will be detected, and thus, it is possible to determine that a threshold value for detecting abnormality exists between the two types of pseudo abnormality signal levels.

Furthermore, in the same manner as in FIG. 4 of Embodiment 1, in a case where the pseudo abnormality signal is inputted in one or more continuous periods and the diagnosis circuit detects a failure using the pseudo abnormality signal in the one or more continuous periods, it may be determined that the diagnosis circuit is normal.

In a case where abnormality is detected by inputting the pseudo abnormality signal, the abnormality detection is masked by the control circuit 10 or the like and control is performed such that an operation of the load drive circuit is not affected.

Embodiment 4

Figure 7:
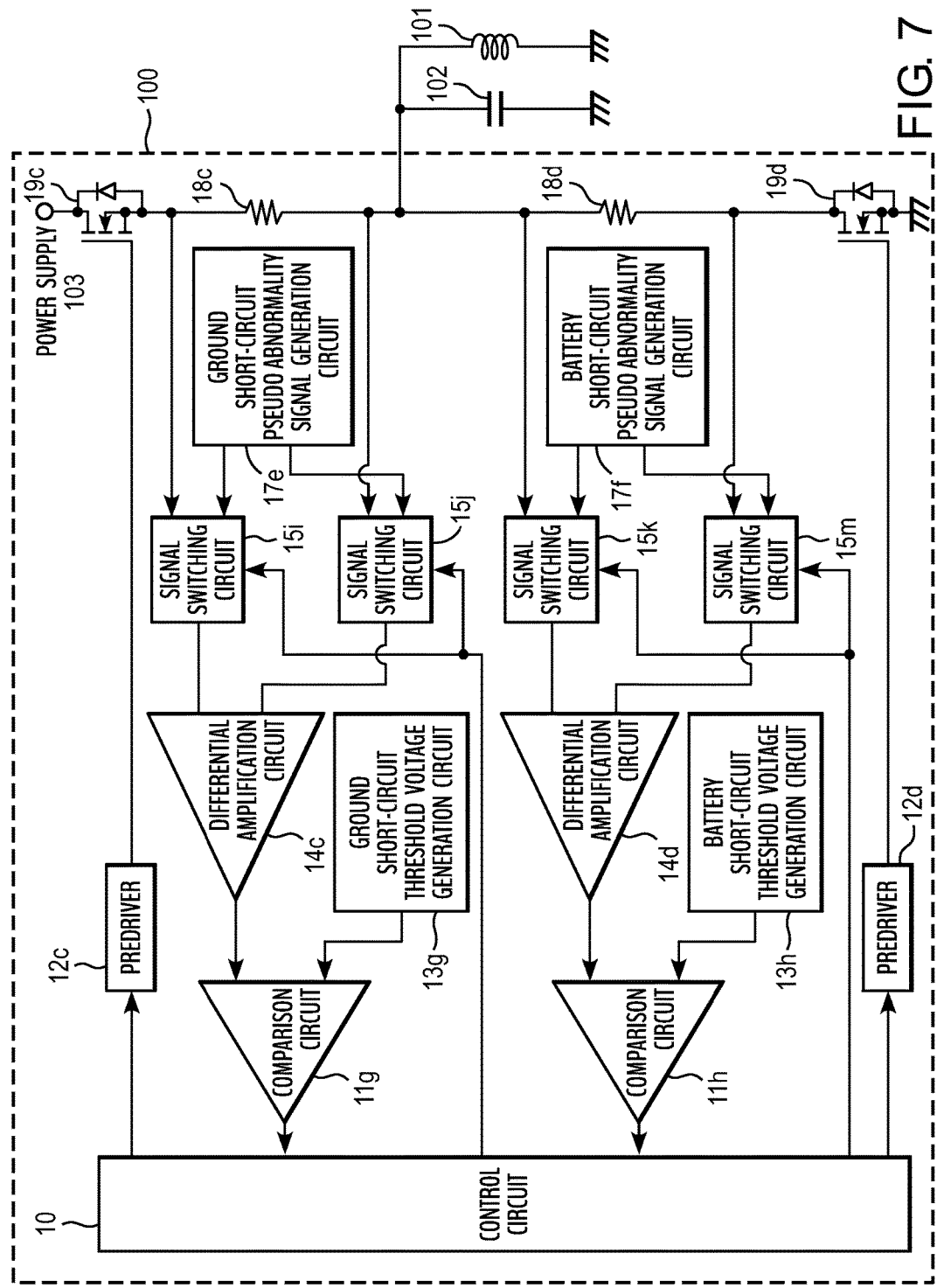
FIG. 7 illustrates a load drive circuit with a half bridge configuration having the ground short-circuit detection circuit and the battery short-circuit detection circuit as the diagnosis circuit.

FIG. 7 relates to Embodiment 4, and illustrates a load drive circuit with a half bridge configuration which has a battery short-circuit detection function and a ground short-circuit detection function according to an overcurrent detection as the diagnosis circuit and is configured with a high side drive element MOSFET 19c and a low side drive element MOSFET 19d.

A load drive element of a load drive circuit illustrated in FIG. 7 performs operations of causing a current to flow to the load 101 from a power supply 103 by turning on the high side drive element MOSFET 19c and turning off the low side drive element MOSFET 19d, and causing a freewheeling current to flow through the load 101 according to the accumulated energy by turning off the high side drive element MOSFET 19c and turning on the to side drive element MOSFET 19d. That is, the high side drive element MOSFET 19c and the low side drive element MOSFET 19d drive the load 101 without being simultaneously turned on.

When the high side drive element MOSFET 19c is turned on and the low side drive element MOSFET 19d is turned off, in a case where a around short-circuit occurs due to abnormality of the load 101, a large current flows through a current detection resistor 18c and thereby a both-terminal voltage difference of the current detection resistor 18c increases, an output voltage of the differential amplification circuit 14c which amplifies the both-terminal voltage difference increases, and a comparison circuit 11g compares the output voltage of the differential amplification circuit 14c with a voltage which is generated by a ground short-circuit threshold voltage generation circuit 13g, and in a case were the output voltage of the differential amplification circuit 14c is higher than the voltage which is generated by the ground short-circuit threshold voltage generation circuit 13g, ground short-circuit detection means in the load drive circuit illustrated in FIG. 7 determines that an overcurrent state occurs due to a ground short-circuit.

In addition, when the high side drive element MOSFET 19c is turned off and the low side drive element MOSFET 19d is turned on, in a case where the battery short-circuit occurs due to abnormality of the load 101, a large current flows through a current detection resistor 18d and thereby a both-terminal voltage difference of the current detection resistor 18d increases, an output voltage of a differential amplification circuit 14d which amplifies the both-terminal voltage difference increases, and a comparison circuit 11h compares the output voltage of the differential amplification circuit 14d with a voltage which is generated by a battery short-circuit threshold voltage generation circuit 13h, and in a case where the output voltage of the differential amplification circuit 14d is higher than the voltage which is generated by the battery short-circuit threshold voltage generation circuit 13h, battery short-circuit detection means of the load drive circuit illustrated in FIG. 7 determines that the overcurrent state occurs due to the battery short-circuit.

Furthermore, while e not illustrated, when the drive element MOSFET 19d is turned off and the drive element MOSFET 19c is turned on, in a case where a current flowing through the current detection resistor 18c is less than a predetermined current value, load open-circuit detection means of the load drive circuit illustrated in FIG. 7 can also determine that the load is in an open state.

In a case where the around short-circuit occurs due to abnormality of the load, when the high side drive element MOSFET 19c is turned off, the current does not flow through the current detection resistor 18c, and thus, it is not possible to detect the ground short-circuit due to the overcurrent. That is, when the high side drive element MOSFET 19c is turned off, it is not necessary to diagnose the ground short-circuit due to abnormality of the load 101, and thus, during this period, a pseudo abnormality signal is inputted to the diagnosis circuit which diagnoses the ground short-circuit, and thereby it is possible to determine whether or not the diagnosis circuit fails without affecting the load drive control.

Specifically, during a period in which the drive element MOSFET 19c is turned on, the control circuit 10 controls signal switching circuits 15i and 15j, thereby connecting an upper side signal and a lower side signal of the current detection resistor 18c to the differential amplification circuit 14c. By the ground short-circuit, a large current flows through the current detection resistor 18c and thereby a both-terminal voltage difference of the current detection resistor 18c increases, and an output voltage of the differential amplification circuit 14c which amplifies the both-terminal voltage difference increases, and if the output voltage exceeds a voltage which is generated by the ground short-circuit threshold voltage generation circuit 13g, it is determined that an overcurrent flows due to the ground short-circuit and the control circuit 10 is notified of the ground short-circuit. The control circuit 10 which is notified of the generation of the ground short-circuit transmits a signal for stopping a current by turning off the high side drive element MOSFET 19b to a predriver 12c.

Meanwhile, during a period in which the high side drive element MOSFET 19c is turned off, the control circuit 10 controls the signal switching circuits 15i and 15j, thereby connecting a voltage which is generated by the ground short-circuit pseudo abnormality signal generation circuit 17e which generates a voltage corresponding to a voltage that is generated on an upper side and a lower side of the current detection resistor 18c in a case where an overcurrent flows due to the ground short-circuit to the differential amplification circuit 14c.

The comparison circuit 11g compares the voltage which is generated by the ground short-circuit pseudo abnormality signal generation circuit 17e and is amplified by the differential amplification circuit 14c with the voltage which is generated by the ground short-circuit threshold voltage generation circuit 13g, and notifies the control circuit 10 of detected abnormality, in a case where the voltage which is generated by the ground short-circuit pseudo abnormality signal generation circuit 17e and amplified by the differential amplification circuit 14c is higher than the voltage which is generated by the ground short-circuit threshold voltage generation circuit 13g. Since the voltage which is generated by the ground short-circuit pseudo abnormality signal generation circuit 17e generates a voltage corresponding to the voltage which is generated on the upper side and the lower side of the current detection resistor 18c when the ground short-circuit occurs, it can be determined that the diagnosis circuit is normal in a case where the comparison circuit 11g detects abnormality. Meanwhile, in a case where the comparison circuit 11g does not detect abnormality, the diagnosis circuit is determined to fail.

In the same manner, in a case where the battery short-circuit occurs due to abnormality of the load, when the low side drive element MOSFET 19d is turned off, a current does not flow through the current detection resistor 13d, and thus, it is not possible to detect the battery short-circuit due to an overcurrent. That is, when the low side drive element MOSFET 19d is turned off, it is not necessary to diagnose the battery short-circuit due to the abnormality of the load 101, and thus, a pseudo abnormality signal is inputted to the diagnosis circuit which diagnoses the battery short-circuit during this period, and thereby, it is possible to determine whether or not the diagnosis circuit fails without affecting the load drive control.

Here, if the battery short-circuit occurs when the low side drive element MOSFET 19d is turned on, a current flows from a drain side to a source side of the low side drive element MOSFET 19d. Meanwhile, in a case where a freewheeling current flows due to energy accumulated in the load 101, the freewheeling current flows from the source side to the drain side. The freewheeling current increases due to effects on drift of resistance components or inductance components of the load 101, and there is also a possibility that an overcurrent flows by the freewheeling current. That is, since a current flows in both directions of the current detection resistor 18d, an overcurrent diagnosis circuit including the current detection resistor 18d has a configuration in which an overcurrent which further flows can also be detected.

Specifically, during a period in which the drive element MOSFET 19d is turned on, the control circuit 10 controls signal switching circuits 15k and 15m, thereby connecting an upper side signal (here, drain side of the drive element MOSFET 19d) and a lower side signal (here, source side of the drive element MOSFET 19d) of the current detection resistor 18d to the differential amplification circuit 14d. By the battery short-circuit, a large current flows through the current detection resistor 18d and thereby a both-terminal voltage difference of the current detection resistor 18d increases, the output voltage of the differential amplification circuit 14d which amplifies the both-terminal voltage difference increases, and when the output voltage exceeds a voltage which is generated by the battery short-circuit threshold voltage generation circuit 13h, it is determined that an overcurrent flows due to the battery short-circuit and the control circuit 10 is notified of the battery short-circuit. The control circuit 10 which is notified of the generation of the ground short-circuit transmits a signal for stopping a current by turning off the low side drive element MOSFET 19d to a predriver 12d.

Meanwhile, during a period in which the drive element MOSFET 19d is turned off, the control circuit 10 controls the signal switching circuits 15k and 15m, thereby connecting a voltage which is generated by the battery short-circuit pseudo abnormality signal generation circuit 17f which generates a voltage corresponding to a voltage that is generated on an upper side and a lower side of the current detection resistor 18*d* in a case where an overcurrent flows due to the battery short-circuit to the differential amplification circuit 14*d*.

The comparison circuit 11*h* compares the voltage which is generated by the battery short-circuit, pseudo abnormality signal generation circuit 17*f* and is amplified by the differential amplification circuit 14*d* with the voltage which is generated by the battery short-circuit threshold voltage generation circuit 13*h*, and notifies the control circuit 10 of detected abnormality, in a case where the voltage which is generated by the battery short-circuit pseudo abnormality signal generation circuit 17*f* and is amplified by the differential amplification circuit 14*d* is higher than the voltage which is generated by the battery short-circuit threshold voltage generation circuit 13*h*. Since, the voltage which is generated by the battery short-circuit pseudo abnormality signal generation circuit 17*f* generates a voltage corresponding to the voltage which is generated on the upper side and the lower side of the current detection resistor 18*d* when the battery short-circuit occurs, it can be determined that the diagnosis circuit is normal in a case where the comparison circuit 11*h* detects abnormality. Meanwhile, in a case where the comparison circuit 11*h* does not detect abnormality, the diagnosis circuit is determined to fail.

In order to determine abnormality of an overcurrent which flows in both directions of the current detection resistor 18*d*, the battery short-circuit pseudo abnormality signal generation circuit 17*f* generates pseudo abnormality signals of at least two types (an overcurrent flowing from a drain to a source of the low side drive element MOSFET 19*d* and an overcurrent flowing from the source to the drain), the differential amplification circuit 14*d* includes a bias circuit if necessary, the comparison circuit 11*h* is configured by two comparison circuits which include two threshold voltage generation circuits different from each other, if necessary.

Here, as described above, when the high side drive element MOSFET 19*c* is turned on and the low side drive element MOSFET 19*d* is turned off, in a case where a current flowing through the current detection resistor 18*c* is less than a predetermined current value, the load open-circuit detection means (not illustrated) of the load drive circuit illustrated in FIG. 7 can also determine that the load is in an open state. That is, when the high side drive element. MOSFET 19*c* is turned off and the low side drive element MOSFET 19*d* is turned on, a pseudo abnormality voltage corresponding to the voltage which is generated in the current detection resistor 18*d* when a load open-circuit occurs is inputted to the load open-circuit detection means, and thus, it is determined whether or not the diagnosis circuit which diagnoses the load open-circuit fails.

In inputting the pseudo abnormality signal to the diagnosis circuit, one or more pseudo abnormality signals are inputted while the drive element MOSFETs 19*c* and 19*d* are turned on within one cycle of the control signal, and when the diagnosis circuit detects one or more abnormalities, it may be determined that the diagnosis circuit is normal.

In addition, in the same manner as in FIG. 4(*d*) of Embodiment 1, the battery short-circuit pseudo abnormality signal generation circuit 17*f*, and the around short-circuit pseudo abnormality signal generation circuit 17*e* input at least two types of pseudo abnormality signals of the pseudo abnormality signal of a level in which abnormality will not be detected and the pseudo abnormality signal of a level in which abnormality will be detected, and thus, it is possible to determine that a threshold value for detecting abnormality exists between the two types of pseudo abnormality signal levels.

Furthermore, in the same manner as in FIG. 4 of Embodiment 1, in a case where the pseudo abnormality signal is inputted in one or more continuous periods and the diagnosis circuit detects a failure using the pseudo abnormality signal in the one or more continuous periods, it may be determined that the diagnosis circuit is normal.

In a case where a failure is detected by inputting the pseudo abnormality signal, the abnormality detection is masked by the control circuit 10 or the like and control is performed such that an operation of the load drive circuit is not affected.

Embodiment 5

Figure 8:
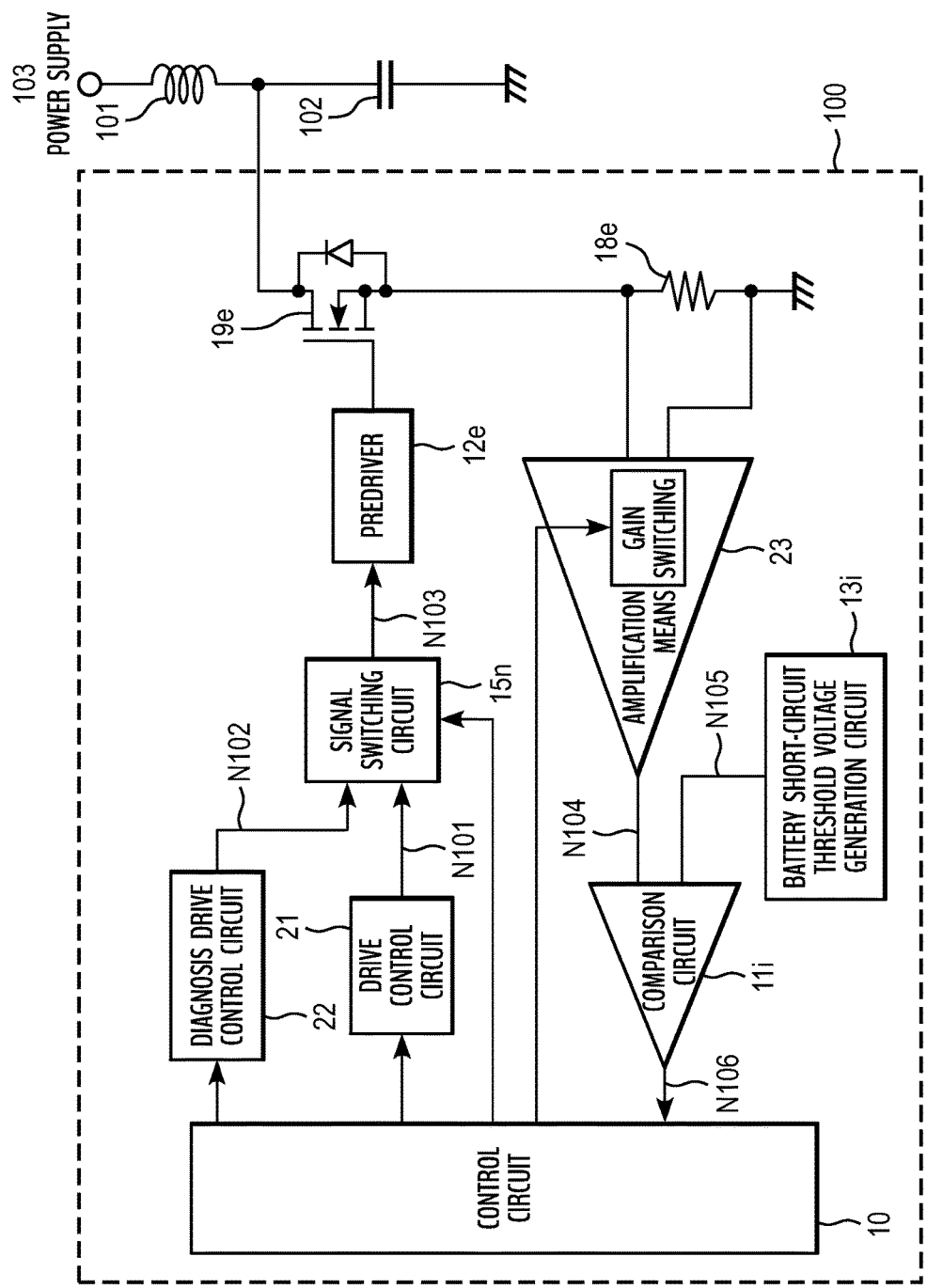
FIG. 8 illustrates a load drive circuit 2 with the low side driver configuration having the battery short-circuit detection circuit as the diagnosis circuit.

FIG. 8 relates to Embodiment 5, and illustrates a load drive circuit with the low side driver configuration having a battery short-circuit detection function according to overcurrent detection as the diagnosis circuit.

A load drive circuit 100 illustrated in FIG. 8 is a circuit which is provided in a lower portion of the power supply 103 and the load 101, and is configured by a drive element MOSFET 19*e* and a predriver 12*a* for driving the drive element MOSFET, a current detection resistor 18*e* for monitoring a current flowing through the drive element MOSFET 19*e*, a differential amplification circuit 23 which includes a predetermined gain for amplifying a signal that is converted into a voltage by the current detection resistor 18*e*, and at least two types of gains among gains higher than the predetermined gain, and in which the two types of gains can be changed, a battery short-circuit threshold voltage generation circuit 13*i* which determines a threshold value determining whether or not an overcurrent flows due to the battery short-circuit, comparison circuit 11*i* which determines whether or not the overcurrent flows by comparing an output voltage of the differential amplification circuit 23 that can change a gain with the battery short-circuit threshold voltage generation circuit 13*i*, a drive control circuit 21 which controls the drive element MOSFET 19*e* for load drive control, a diagnosis drive control circuit 22 which is separately provided from the drive control circuit 21 and controls the drive element MOSFET 19*e* for confirming whether or not a battery short-circuit detection circuit fails, a signal switching circuit 15*n* which is connected to the predriver 12*a* and switches a signal of the drive control circuit 21 and a signal of the diagnosis drive control circuit 22 to each other, and a control circuit 10 which controls operations thereof.

While not illustrated, the load drive circuit may include a clamp diode for protecting drive elements or a free wheeling diode which refluxes a current, according to characteristics of the load that is driven.

The diagnosis circuit which diagnoses a battery short-circuit of FIG. 8 is configured by the current detection resistor 18*e*, the differential amplification circuit 23 which can change a gain, the battery short-circuit threshold voltage generation circuit 13*i*, and the comparison circuit 11*i*.

In a case where a battery short-circuit occurs due to abnormality of the load 101 when the drive element MOSFET 19*e* is turned on, a large current flows through the current detection resistor 18*e* and thereby the both-terminal voltage difference of the current detection resistor 18*e* increases, an output voltage of the differential amplification circuit 23 which amplifies the both-terminal voltage difference increases, and when the output voltage exceeds a voltage which is generated by the battery short-circuit threshold voltage generation circuit 13*i*, the diagnosis circuit which diagnoses the battery short-circuit determines that an overcurrent flows due to the battery short-circuit and notifies the control circuit 10. The control circuit 10 which is notified of the generation of the battery short-circuit transmits a signal for stopping a current by turning off the drive element MOSFET 19e to the predriver 12e.

Meanwhile, when the drive element MOSFET 19e is turned off, a current does not flow even in a case where the battery short-circuit occurs due to the abnormality of the load 101, and thus, the diagnosis circuit does not need to diagnose the battery short-circuit.

That is, in a case where the drive element is switched to ON or OFF for load drive control, when the drive element does not need diagnosis which is performed by the diagnosis circuit, it is possible to prevent the failure of the diagnosis circuit from becoming a potential failure without affecting the load drive for vehicle control, if whether or not the diagnosis circuit fails is confirmed.

Figure 9:
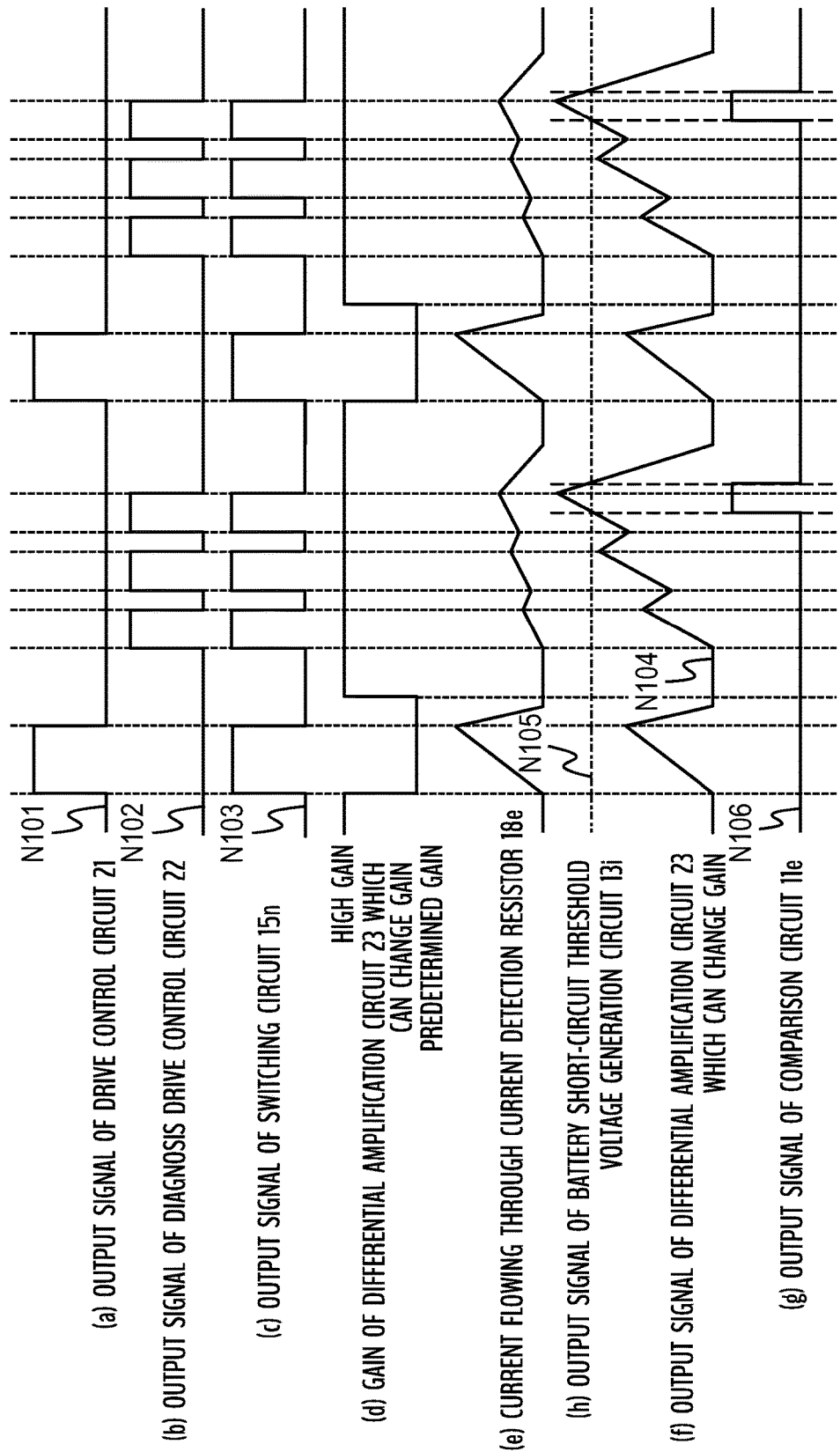
FIG. 9 is a timing chart illustrating an operation of FIG. 8.

Hereinafter, an operation of Embodiment 5 will be described with reference to FIG. 9.

FIG. 9(a) illustrates an output signal N102 of the drive control circuit 21 for controlling the drive element MOSFET 19e for load drive.

FIG. 9(b) illustrates an output signal N102 of the diagnosis drive control circuit 22. When the drive control circuit 21 outputs a signal with a low level and the drive element MOSFET 19e is in a turn-off state, the diagnosis drive control circuit 22 generates a signal with a frequency which satisfies conditions that will be described below and characteristics of a duty, and outputs the output signal N102.

The control circuit 10 confirms whether the drive element MOSFET 19e is in a state of being turned on or in a state of being turned off so as to perform load drive control, and switches the signal switching circuit 15n, according to a state thereof. The signal switching circuit 15n outputs an output of the drive control circuit 21 to the predriver 12e, when the drive element MOSFET 19e is turned on, and outputs an output of the diagnosis drive control circuit 22 to the predriver 12e, when the drive element MOSFET 19e is turned off.

An output signal N103 of the signal switching circuit 15n which is connected to the predriver 12e becomes a signal of FIG. 9(c), according to control of the signal switching circuit 15n, and the drive element MOSFET 19e is driven at a timing of a waveform of FIG. 9(c).

Here, illustrated in FIG. 9(d), a gain of the differential amplification circuit 23 is set to a predetermined gain which is required for load drive control when the drive element MOSFET 19e is turned on, and is set to a gain higher than the predetermined gain when the drive element MOSFET 19e is turned off. When the gain is changed to a gain higher than the predetermined gain, false detection of the overcurrent is prevented by a discharging current or the like of the energy accumulated in the load, and thus, delay time is generated in switching timing.

Next, a current flowing through the current detection resistor 18e is illustrated in FIG. 9(e). When the drive control circuit 21 outputs a signal with a high level and thereby the drive element MOSFET 19e is turned on, it is necessary for a current sufficient for driving the load to flow, and thus, a signal with a high level is outputted during a period required for the flowing. Meanwhile, when the diagnosis drive control circuit 22 controls the drive element MOSFET 19e, a frequency and a duty are set to be equal to or less than the current amount which does not drive the load, during a period in which the drive control circuit 21 outputs a signal with a low level.

A period in which the diagnosis drive control circuit 22 controls the drive element MOSFET 19e is a period in which the drive element MOSFET 19e has to be turned off for load control, but during this period, a current flows which is equal to or less than the current amount which does not drive the load in accordance with adjustment of a frequency and a duty, the current is inputted to the diagnosis circuit which diagnoses a battery short-circuit by detecting an overcurrent, as a pseudo abnormality signal, and thus, it is determined whether or not the diagnosis circuit fails. Since a negative overcurrent flowing during this period does not affect negative drive control the diagnosis drive control circuit 22 adjusts a frequency and a duty of the output signal so that the current is equal to or less than a current amount which does not drive the load and to be a desired current amount.

A gain higher than the predetermined gain of the differential amplification circuit 23 which can change a gain is set to a value which can be used as a pseudo abnormality signal by a load current according to control of the diagnosis drive control circuit 22. That is, the load current according to the control of the diagnosis drive control circuit 22 is converted into a voltage by the current detection resistor 18e and the differential amplification circuit 23 amplifies the voltage, and as the result, a gain thereof is set such that an output of the differential amplification circuit 23 becomes a voltage exceeding a voltage which is generated by the battery short-circuit threshold voltage generation circuit 13i.

An output waveform of the differential amplification circuit 23 which is obtained as the result of switching a gain of the differential amplification circuit 23 is illustrated in FIG. 9(f). FIG. 9(h) illustrates a voltage which is generated by the battery short-circuit threshold voltage generation circuit 13i. When a current, flows which is equal to or less than a current amount which does not drive the load, a gain higher than the predetermined gain of the differential amplification circuit 23 is set such that an output voltage of the differential amplification circuit 23 exceeds the voltage which is generated by the battery short-circuit threshold voltage generation circuit 13i, and thus, the comparison circuit 11e detects generation of an overcurrent and notifies the control circuit 10 of the generation of the overcurrent. FIG. 9(g) illustrates an output waveform of the comparison circuit 11e. Meanwhile, in a case where the comparison circuit 11e does not detect a failure, it is determined that a failure occurs in at least one portion of the diagnosis circuit which is configured with the current detection resistor 18e, the differential amplification circuit 23 which can change a gain, the battery short-circuit threshold voltage generation circuit 13i, and the comparison circuit 11i.

As described above, in a period in which the drive element MOSFET 19e is turned off, the drive element MOSFET 19e is controlled by a drive signal for diagnosing, a negative overcurrent flowing at that time is inputted to a battery short-circuit diagnosis circuit, as a pseudo abnormality signal, and thus, it is possible to perform diagnosis by including the current detection resistor.

In inputting the pseudo abnormality signal to the diagnosis circuit, one or more pseudo abnormality signals are inputted while the drive element MOSFET 19a is turned on within one cycle of the control signal, and when the diagnosis circuit detects one or more abnormalities, it may be determined that the diagnosis circuit is normal.

In addition, in the same manner as in FIG. 4(d) of Embodiment 1, the diagnosis drive control circuit 22 inputs at least two types of pseudo abnormality signals among a current of a level in which abnormality will not be detected and a current of a level in which abnormality will be detected, and thus, it is possible to determine that a threshold value for detecting abnormality exists between the two types of pseudo abnormality signal levels.

Furthermore, in the same manner as in FIG. 4 of Embodiment 1, in a case where the pseudo abnormality signal is inputted in one or more continuous periods and the diagnosis circuit detects a failure using the pseudo abnormality signal in the one or more continuous periods, it may be determined that the diagnosis circuit is normal.

In a case where abnormality is detected by inputting the pseudo abnormality signal, the abnormality detection is masked by the control circuit 10 or the like and control is performed such that an operation of the load drive circuit is not affected.

Embodiment 6

While not illustrated, the method of confirming whether or not the diagnosis circuit fails by inputting the pseudo abnormality signal to the diagnosis circuit, as described in Embodiments 1 to 5, when the diagnosis circuit does not need to diagnose, can also be applied to a function which detects an overcurrent of a switching regulator.

A switching element of the switching regulator repeats a turn-on state and a turn-off state. When the switching element is turned on, diagnosis of an overcurrent is performed, but when the switching element is turned off, a current does not flow and thus, it is not necessary to diagnose the overcurrent. At the time of this state, a pseudo abnormality signal corresponding to a signal which is generated at the time of the overcurrent is inputted to a diagnosis circuit which diagnoses the overcurrent, and thus, it is possible to determine whether or not an overcurrent diagnosis function fails.

REFERENCE SIGNS LIST

10: control circuit
11a to 11i: comparison circuit
12a to 12e: predriver
13a: battery short-circuit threshold voltage generation circuit (low side driver configuration)
13b: ground short-circuit threshold voltage generation circuit (low side driver configuration)
13c: load open-circuit threshold voltage generation circuit (low side driver configuration)
13d: battery short-circuit threshold voltage generation circuit (high side driver configuration)
13e: load open-circuit threshold voltage generation circuit (high side driver configuration)
13f: ground short-circuit threshold voltage generation circuit (high side driver configuration)
13g: ground short-circuit threshold voltage generation circuit (half bridge configuration)
13h: battery short-circuit threshold voltage generation circuit (half bridge configuration)
14a to 14d: differential amplification circuit
15a to 15n: signal switching circuit
17a: battery short-circuit pseudo abnormality signal generation circuit (low side driver configuration)
17b: ground short-circuit pseudo abnormality signal generation circuit (low side driver configuration)
17c: load open-circuit pseudo abnormality signal generation circuit (low side driver configuration)
17d: battery short-circuit pseudo abnormality signal generation circuit (high side driver configuration)
17e: load open-circuit pseudo abnormality signal generation circuit (high side driver configuration)
17f: ground short-circuit pseudo abnormality signal generation circuit (high side driver configuration)
17e: ground short-circuit pseudo abnormality signal generation circuit (half bridge configuration)
17g: battery short-circuit pseudo abnormality signal generation circuit (half bridge configuration)
18a to 18e: current detection resistor
19a to 19e: drive element MOSFET
20a, 20h: constant current source
21: drive control circuit
22: diagnosis drive control circuit
23: differential amplification circuit which can change gain
100: load drive circuit
101: load
102: capacitor
103, 104: power supply
N10a: drain signal of drive element MOSFET 19a (low side configuration)
N10b: source signal of drive element MOSFET 19b (high side configuration)
N11a: upper side signal of current detection resistor 18a
N11b: lower side signal of current detection resistor 18a
N12a: upper side output signal of battery short-circuit pseudo abnormality signal generation circuit 17a
N12b: lower side output signal of battery short-circuit pseudo abnormality signal generation circuit 17a
N13a: output signal of signal switching circuit 15a
N13b: output signal of signal switching circuit 15b
N14: switching signal of signal switching circuits 15a and 15b
N15: gate input signal of drive element MOSFET 19a
N16: output signal of differential amplification circuit 14a
N17: output signal of battery short-circuit threshold voltage generation circuit 13a
N18: output signal of comparison circuit 11a
N101: output signal of drive control circuit 21
N102: output signal of diagnosis drive control circuit 22
N103: output signal of signal switching circuit 15g
N104: output signal of differential amplification circuit 23 which can change gain
N105: output signal of battery short-circuit threshold voltage generation circuit 13i
N106: output signal of comparison circuit 11a
P10: pseudo abnormality signal of level in which overcurrent will not be detected
P11: pseudo abnormality signal of level in which overcurrent will be detected

The invention claimed is:
1. A load drive circuit comprising:
a load drive element that drives a load which is mounted on a vehicle;
a diagnosis circuit including a detection unit that measures a physical quantity which is a detection target and outputs the measured physical quantity as a detection signal so as to diagnose an abnormality of the load;
a pseudo abnormality signal generation circuit that generates a pseudo abnormality signal corresponding to a physical quantity which is generated when the abnormality occurs in the load; and
a signal switching circuit that switches a signal which is inputted to the diagnosis circuit to a detection signal which is outputted from the detection unit or to the pseudo abnormality signal generation circuit, wherein the diagnosis circuit diagnoses whether or not the abnormality occurs in the load, based on the signal which is outputted from the detection unit, wherein, during an operation of the vehicle, whether or not the abnormality occurs in the load is diagnosed, wherein whether or not the diagnosis circuit fails is determined.

2. The load drive circuit according to claim 1, wherein, the diagnosis circuit diagnoses a state of the load when there is a need to diagnose abnormality of the load, and the load drive circuit performs a predetermined operation in a case where generation of abnormality of the load is detected, wherein, when there is no need to diagnose abnormality of the load, the pseudo abnormality signal that is outputted from the pseudo abnormality signal generation circuit is inputted to the diagnosis circuit, and whether or not the diagnosis circuit fails is determined, wherein, by inputting the pseudo abnormality signal, the diagnosis circuit is determined to be normal in a case where the diagnosis circuit detects abnormality of the load, and the diagnosis circuit is determined to fail in a case where the diagnosis circuit does not detect abnormality of the load, and wherein the load drive circuit performs a predetermined operation.

3. The load drive circuit according to claim 1, wherein the load drive circuit is a switching regulator that switches the load drive element and outputs a predetermined voltage by increasing or decreasing a voltage which is input.

4. The load drive circuit according to claim 1, wherein, in determining that the diagnosis circuit fails, the pseudo abnormality signal is inputted to the diagnosis circuit for a predetermined continuous number of times when there is no need to diagnose abnormality of the load, the diagnosis circuit is determined to be normal in a case where the diagnosis circuit detects a failure for the predetermined continuous number of times, and the diagnosis circuit is determined to fail in a case where the diagnosis circuit does not detect a failure for the predetermined continuous number of times.

5. The load drive circuit according to claim 4, wherein the pseudo abnormality signal is inputted to the diagnosis circuit during one or more continuous periods, and the diagnosis circuit is determined to be normal in a case where the diagnosis circuit detects the pseudo abnormality signal which is inputted during the one or more continuous periods.

6. The load drive circuit according to claim 5, wherein, in a case where a physical quantity which is generated when abnormality occurs in the load departs from a predetermined threshold value, at least two types of the pseudo abnormality signals among the pseudo abnormality signal that does not depart from the threshold value and the pseudo abnormality signal that departs from the threshold value are inputted to the diagnosis circuit which determines that abnormality occurs in the load, and thereby whether or not the predetermined threshold value departs from a predetermined range is determined.

7. The load drive circuit according to claim 6, wherein the diagnosis circuit which diagnoses abnormality of the load includes at least one of a circuit which diagnoses a battery short-circuit, a circuit which diagnoses a ground short-circuit, a circuit which diagnoses an overcurrent, and a circuit which diagnoses a load open-circuit.

8. The load drive circuit according to claim 7, wherein a configuration of the load drive circuit includes any one configuration of a low side driver configuration, a high side driver configuration, a push-pull configuration, a half-bridge configuration, and a full-bridge configuration.

9. The load drive circuit according to claim 8, wherein at least a part of the load drive element, the signal switching circuit, the detection unit, the diagnosis circuit, a comparison circuit which compares a physical quantity which is generated when abnormality occurs in the load with a threshold value for determining that abnormality occurs in the load, and the pseudo abnormality signal generation circuit, is embedded in a semiconductor integrated circuit.

10. The load drive circuit according to claim 9, wherein the load drive element is configured by any one or a combination of a FET, a bipolar transistor, and IGBT.

11. The load drive circuit according to claim 10, wherein the detection unit which detects a load current flowing through the load is any one or a combination of a resistor and a sense MOS.

12. A load drive circuit comprising:

a load drive element that drives a load which is mounted on a vehicle;

a diagnosis circuit including a detection unit that measures a physical quantity which is a detection target and outputs the measured physical quantity as a detection signal so as to diagnose an abnormality of the load;

a drive control circuit that controls the load drive element;

a diagnosis drive control circuit that is separately provided from the drive control circuit and controls the load drive element;

a signal switching circuit that switches a circuit which controls the load drive element to the drive control circuit or the diagnosis drive control circuit; and an amplification circuit that has a gain which can be switched, wherein the diagnosis circuit diagnoses whether or not the abnormality occurs in the load, based on the signal which is outputted from the detection unit, wherein, during an operation of the vehicle, whether or not the abnormality occurs in the load is diagnosed, wherein a circuit that controls the drive element is switched to the diagnosis drive control circuit by the signal switching circuit and switches the gains of the amplification circuit, during a period in which the drive control circuit controls the load drive element so as to be in a turn-off state, wherein the diagnosis drive control circuit controls the load drive element such that a current flowing through the load is equal to or less than a drive current amount of the load and is a desired current amount, wherein the current that is equal to or less than the drive current amount and is the desired current amount is amplified by the amplification circuit and is inputted to the diagnosis circuit, and wherein whether or not the diagnosis circuit fails is determined.

13. The load drive circuit according to claim 12, wherein at least a part of the drive control circuit, the diagnosis drive control circuit, and the amplification circuit, is embedded in a semiconductor integrated circuit.

* * * * *